United States Patent
Tsai et al.

(10) Patent No.: US 8,430,439 B2
(45) Date of Patent: Apr. 30, 2013

(54) SURFACE MOUNT MACHINE NOZZLE

(75) Inventors: Tsung-Chih Tsai, New Taipei (TW);
Shang-Yu Lin, New Taipei (TW);
Chao-An Kang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/278,053

(22) Filed: Oct. 20, 2011

(65) Prior Publication Data

US 2012/0117794 A1     May 17, 2012

(30) Foreign Application Priority Data

Nov. 16, 2010  (TW) .............................. 99139320 A

(51) Int. Cl.
*B65G 47/91* (2006.01)

(52) U.S. Cl.
USPC .............................. 294/64.3; 294/186; 29/743

(58) Field of Classification Search .................. 29/743, 29/740–742, 739, DIG. 44; 294/185–186, 294/907; 414/752.1; 901/40
See application file for complete search history.

(56) References Cited

U.S. PATENT DOCUMENTS

| | | | | |
|---|---|---|---|---|
| 4,815,779 A * | 3/1989 | Glessner et al. | ........... | 414/752.1 |
| 4,995,662 A * | 2/1991 | Hawkswell | .................. | 294/188 |
| 6,000,122 A * | 12/1999 | Uchida et al. | .................. | 29/740 |
| 6,457,759 B1 * | 10/2002 | Unokuchi | ..................... | 294/186 |
| 6,735,853 B2 * | 5/2004 | Lee | ................. | 29/739 |
| 7,278,204 B2 * | 10/2007 | Isogai et al. | .................... | 29/743 |
| 7,480,985 B2 * | 1/2009 | Yan | ................. | 29/740 |
| 2004/0139597 A1 * | 7/2004 | Oyama | ........................ | 29/743 |
| 2007/0289125 A1 * | 12/2007 | Uchida et al. | .................. | 29/743 |

* cited by examiner

*Primary Examiner* — Minh Trinh
(74) *Attorney, Agent, or Firm* — Altis Law Group, Inc.

(57) ABSTRACT

An exemplary surface mount machine nozzle includes a mounting element, a pneumatic suction nozzle and a fixing pin. The mounting element defines one of a pivot hole and an elongated perforation in a sidewall thereof. The pneumatic suction nozzle defines another one of the pivot hole and the elongated perforation therein. The fixing pin horizontally extends through the pivot hole and the perforation for connecting the mounting element and the pneumatic suction nozzle together. The fixing pin is slidable along the elongated perforation such that the pneumatic suction nozzle is telescopically slidable relative to the mounting element.

19 Claims, 3 Drawing Sheets

SURFACE MOUNT MACHINE NOZZLE

BACKGROUND

1. Technical Field

The present disclosure relates to surface mount devices, and particularly to a nozzle of a surface mount machine.

2. Description of the Related Art

Surface mount technology (SMT) is a method for constructing electronic circuits in which the components (surface-mounted components, "SMCs") are mounted directly onto the surfaces of printed circuit boards (PCBs). An electronic device so made is called a surface mount device. During SMT placement of SMCs, a nozzle of the surface mount machine picks up various SMCs one at a time by vacuum suction from a component tray, and then takes the SMCs to required positions on the PCB. The nozzle generally includes a flat contact surface at a front end thereof, and defines a vacuum suction channel recessed inwardly from the contact surface at a central portion thereof. For an SMT placement, the contact surface is used to contact an outer surface of a SMC. Then a vacuum is gradually created in the vacuum suction channel. Accordingly, the nozzle generates an adhering force to suck up the SMC, such that the SMC can be taken to the required position.

However, during the SMT placement operation, the nozzle directly impacts the SMC or the SMC directly impacts the nozzle. For example, a height clearance between the nozzle and the SMC may be smaller than a normal height clearance due to error. In such case, the nozzle is liable to impact the SMC and may crack the SMC. In other words, in typical manufacturing, the nozzle is liable to reduce production efficiency and quality.

Therefore, it is desirable to provide a surface mount machine nozzle which can overcome the described limitations.

DETAILED DESCRIPTION

Embodiments of a surface mount machine nozzle are described in detail here with reference to the drawings.

Figure 1:
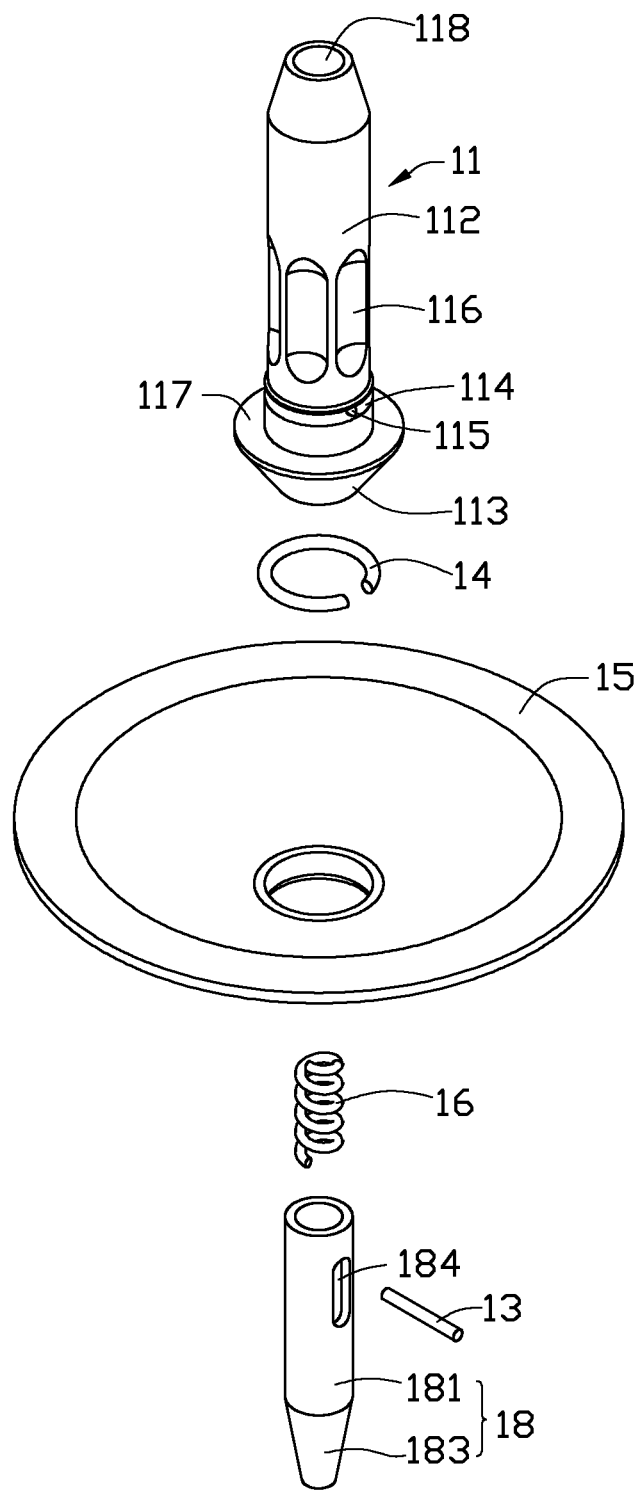
FIG. 1 is an isometric, exploded view of a surface mount machine nozzle according to an exemplary embodiment of the present disclosure.

Referring to FIG. 1, a surface mount machine nozzle 10 according to an exemplary embodiment is shown. The surface mount machine nozzle 10 includes a mounting element 11, a fixing pin 13, a blocking ring 14, a cover 15, an elastic element 16 and a pneumatic suction nozzle 18.

Figure 2:
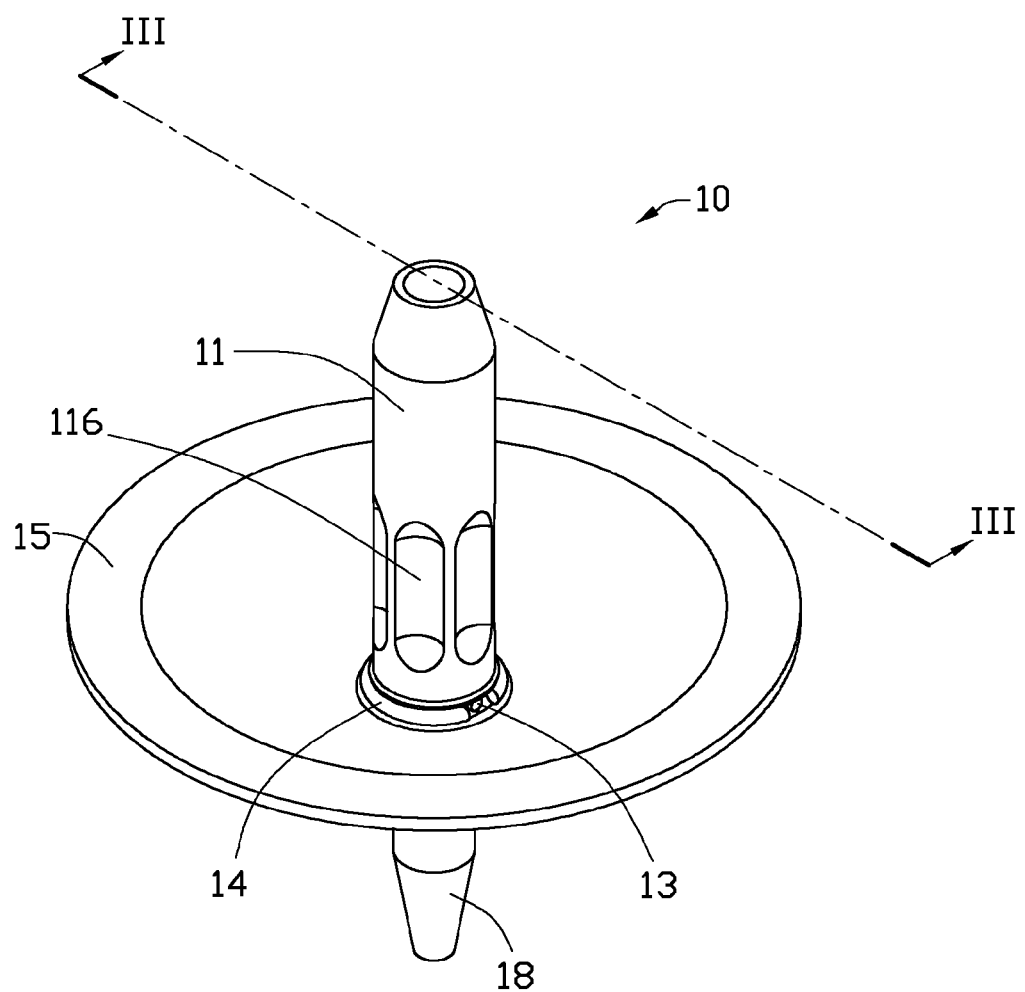
FIG. 2 is an assembled view of the surface mount machine nozzle of FIG. 1.
Figure 3:
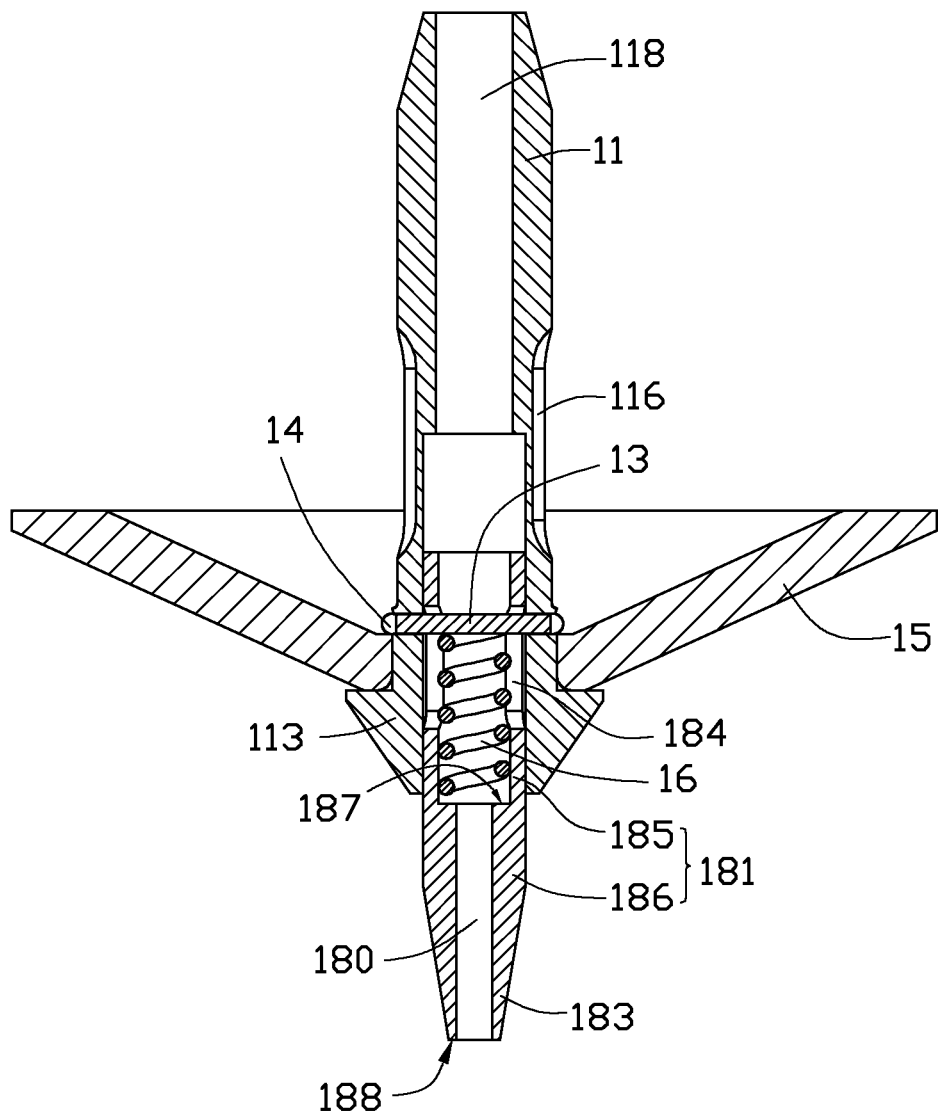
FIG. 3 is a cross section of the surface mount machine nozzle of FIG. 2, taken along line III-III thereof.

The mounting element 11 includes a hollow cylindrical connecting portion 112, and a tapered fixing portion 113 connected with a lower part of the connecting portion 112. The mounting element 11 defines a central hole 118 at a central portion thereof. The central hole 118 extends through the connecting portion 112 and the fixing portion 113 along an axial direction of the mounting element 11. Referring also to FIGS. 2 and 3, an inner diameter of an upper portion of the connecting portion 112 is smaller than an inner diameter of a lower portion of the connecting portion 112. That is, a diameter of an upper portion of the central hole 118 is smaller than a diameter of a lower portion of the central hole 118. The connecting portion 112 defines an annular locating groove 114 at an outer surface thereof near the fixing portion 113, and a pivot hole 115 horizontally extending along a diametrical direction of the connecting portion 112. The pivot hole 115 communicates with the groove 114 at two opposite sides of the connecting portion 112.

The connecting portion 112 defines a plurality of recesses 116 located above the locating groove 114. The recesses 116 are equally angularly spaced from each other along a circumferential direction of the connecting portion 112. The fixing portion 113 has an outer diameter decreased from one end which is connected with the connecting portion 112 towards the other end which is away from the connecting portion 112. An annular step surface 117 is formed at a junction of the connecting portion 112 and the fixing portion 113, because a top of the fixing portion 113 extends radially outward and perpendicularly from an outer surface of the lower part of the connecting portion 112.

The fixing pin 13 is cylindrical shaped. The fixing pin 13 has a diameter substantially equal to that of the pivot hole 115. A length of the fixing pin 13 is substantially equal to an inner diameter of the locating groove 114.

The blocking ring 14 is generally C-shaped. More particularly, the blocking ring 14 is in the shape of part of a ring. An inner diameter of the blocking ring 14 is slightly smaller than or substantially equal to that of the locating groove 114. Thus, the blocking ring 14 can be mounted on the mounting element 11 by being snappingly and interferentially fitted in the locating groove 114 of the mounting element 11. In such position, an outer portion of the blocking ring 14 protrudes out of the locating groove 114.

The cover 15 is generally bowl shaped. In the present embodiment, the cover 15 is generally frustoconical-shaped; more particularly, of a circular frustoconical shape. The cover 15 is made of black plastic material, and provides a single background color for the surface mount machine nozzle 10.

The elastic element 16 is a helical spring. Alternatively, the elastic element 16 can be another kind of elastic member which can be compressed or stretched to provide an elastic force.

The pneumatic suction nozzle 18 includes a hollow cylindrical main body 181, and a tapered head portion 183 located at one end of the main body 181. The main body 181 includes an upper main part 185, and a lower part 186. The pneumatic suction nozzle 18 defines a vacuum suction channel 180 at a central portion thereof. The main part 185 of the main body 181 defines two elongated perforations 184 at two opposite sides thereof, respectively. Each of the perforations 184 extends parallel to an axial direction of the pneumatic suction nozzle 18. The main body 181 of the pneumatic suction nozzle 18 has an outer diameter substantially equal to the diameter of the lower portion of the central hole 118 of the mounting element 11.

An inner diameter of the main part 185 of the main body 181 is smaller than that of the lower part 186 of the main body 181, such that an annular supporting surface 187 is formed at an inner peripheral surface of the main body 181 between the main part 185 and the lower part 186. A distance between the supporting surface 187 and top ends of the perforations 184 is similar to a length of the elastic element 16 when the elastic element 16 is in a natural (unloaded) state. The pneumatic suction nozzle 18 also includes a planar contact surface 188 at a lower part thereof. During an SMT placement operation, the contact surface 188 of the pneumatic suction nozzle 18 contacts a surface mount component (not shown), and then a pressure differential is generated in the vacuum suction channel 180 so that the surface mount component is attached (adhered) to the contact surface 188 by suction.

When the surface mount machine nozzle 10 is assembled, the elastic element 16 is received in the main part 185 of the main body 181 of the pneumatic suction nozzle 18. The main part 185 of the main body 181 of the pneumatic suction nozzle 18 is received in the central hole 118 of the mounting element 11. The lower part 186 of the main body 181 of the pneumatic suction nozzle 18 protrudes below the fixing portion 113 of the mounting element 11. The perforations 184 of the main body 181 are aligned with the pivot hole 115 of the mounting element 11. The fixing pin 13 is extended horizontally through the perforations 184 and the pivot hole 115 to connect the pneumatic suction nozzle 18 and the mounting element 11 together. Two opposite ends of the elastic element 16 respectively contact the fixing pin 13 and the supporting surface 187, and the elastic element 16 is slightly compressed.

Alternatively, the perforations 184 can be defined in the mounting element 11, and the pivot hole 115 can be defined in the main body 181.

When the surface mount machine nozzle 10 is in an initial state, the fixing pin 13 is located at the top ends of the perforations 184, the elastic element 16 is slightly compressed, and a length of the portion of the pneumatic suction nozzle 18 which protrudes out below the mounting element 11 is largest. During an SMT placement operation, when the pneumatic suction nozzle 18 is pushed upward by an external force, such as impacting force from a surface mount component, the pneumatic suction nozzle 18 moves upward relative to the mounting element 11, and the fixing pin 13 slides relative to the perforations 184 from the top ends of the perforations 184 towards lower parts of the perforations 184. A distance between the fixing pin 13 and the step surface 187 of the pneumatic suction nozzle 18 is gradually decreased. Thus, the elastic element 16 is further compressed under urging of the fixing pin 13 and the step surface 187. The length of the portion of the pneumatic suction nozzle 18 which protrudes out below the mounting element 11 is gradually decreased.

If the fixing pin 13 is slid relative to the perforations 184 right down to the bottom ends of the perforations 184, the elastic element 16 is compressed a maximum amount, and the length of the portion of the pneumatic suction nozzle 18 which protrudes out below the mounting element 11 is smallest.

When the external force abates completely or is withdrawn, the elastic element 16 recoils to its original state, thereby pushing the pneumatic suction nozzle 18 to slide downward relative to the mounting element 11 until the fixing pin 13 is again positioned in the top ends of the perforations 184. Accordingly, the pneumatic suction nozzle 18 can be telescopically moved relative to the mounting element 11 to adjust the length of the portion of the pneumatic suction nozzle 18 which protrudes out below the mounting element 11 during the SMT placement operation, and to buffer impact that may occur to the pneumatic suction nozzle 18.

The cover 15 is mounted around the mounting element 11, with an inner periphery of the cover 15 located between the locating groove 114 and the step surface 117. The blocking ring 14 is received in the locating groove 114. The blocking ring 14 and the step surface 117 cooperatively prevent (or at least limit) axial movement of the cover 15.

For SMT placement operations, the surface mount machine nozzle 10 picks up various surface mount components via the pneumatic suction nozzle 18 one at a time and then takes the surface mount components to predetermined positions. Before starting an SMT placement operation, the surface mount machine nozzle 10 is at the initial state. If a height clearance between the pneumatic suction nozzle 18 and the surface mount component is smaller than a normal height clearance due to error, the pneumatic suction nozzle 18 impacts the surface mount component to force the pneumatic suction nozzle 18 to telescopically move relative to the mounting element 11 and thereby adjust the length of the portion of the pneumatic suction nozzle 18 which protrudes out below the mounting element 11. Because of the resilient compression of the elastic element 16, the surface mount machine nozzle 10 has good buffering function. That is, a large impacting force between the pneumatic suction nozzle 18 and the surface mounting element 11 can be avoided, to ensure that the surface mounting component remains intact despite the impact. In another aspect, excessive percussion and wear of the pneumatic suction nozzle 18 can also be avoided, thereby extending the useful working lifetime of the surface mounting machine nozzle 10.

Since the elastic element 16 is slightly compressed in the initial state at the beginning of each SMT placement operation, the position of the pneumatic suction nozzle 18 relative to the mounting element 11 can remain exactly the same for each successive beginning of an SMT placement operation. That is, the length of the portion of the pneumatic suction nozzle 18 which protrudes out below the mounting element 11 is exactly the same at the beginning of each placement operation, so that the accuracy of the next SMT placement operation is ensured.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A surface mount machine nozzle, comprising:
a hollow mounting element defining one of a pivot hole and an elongated perforation in a sidewall thereof;
a pneumatic suction nozzle partly received in the mounting element, the pneumatic suction nozzle defining the other one of the pivot hole and the elongated perforation therein; and
a fixing pin transversely extended through the pivot hole and the perforation for connecting the mounting element and the pneumatic suction nozzle together, the fixing pin being slidable along the elongated perforation such that the pneumatic suction nozzle is telescopically slidable relative to the mounting element;
wherein a supporting surface is formed at an inside of the pneumatic suction nozzle, and an elastic element is received in the pneumatic suction nozzle, two opposite ends of the elastic element respectively contact with the supporting surface and the fixing pin.

2. The surface mount machine nozzle of claim 1, wherein the elongated perforation is defined in the pneumatic suction nozzle, and the pivot hole is defined in the mounting element.

3. The surface mount machine nozzle of claim 2, wherein when the fixing pin is located at one end of the perforation away from the supporting surface, the elastic element is slightly compressed, and a length of a portion of the pneumatic suction nozzle which protrudes out of the mounting element is largest; and when the fixing pin is located at an opposite end of the perforation nearer to the supporting surface, the elastic element is furthest compressed, and the length of the portion of the pneumatic suction nozzle which protrudes out of the mounting element is smallest.

4. The surface mount machine nozzle of claim 1, wherein the pneumatic suction nozzle comprises a main body and a head portion located at a bottom end of the main body, an upper main part of the main body having an inner diameter greater than that of a lower part of the main body such that the supporting surface is formed at a junction of the main part and the lower part, and the elastic element being received in the main part.

5. The surface mount machine nozzle of claim 1, further comprising a cover and a blocking ring, wherein the mounting element comprises a straight, hollow connecting portion and an enlarged, hollow fixing portion connected with an end of the connecting portion, the connecting portion defining a locating groove in an outer surface thereof adjacent to the end thereof, the blocking ring received in the locating groove with an outer circumferential portion of the blocking ring protruding out of the locating groove, and the cover mounted around the mounting element and sandwiched between the blocking ring and the fixing portion.

6. The surface mount machine nozzle of claim 5, wherein the cover is black and generally bowl shaped.

7. The surface mount machine nozzle of claim 5, wherein the pivot hole is located in the connecting portion and communicates with the locating groove.

8. The surface mount machine nozzle of claim 5, wherein the fixing portion and the blocking ring cooperatively prevent axial movement of the cover.

9. A surface mount machine nozzle, comprising:
a hollow mounting element defining a pivot hole in a sidewall thereof;
a pneumatic suction nozzle partly received in the mounting element, the pneumatic suction nozzle comprising an internal supporting surface under the pivot hole;
a fixing pin horizontally extended through the pivot hole; and
an elastic element, wherein two opposite ends of the elastic element respectively contact with the fixing pin and the supporting surface of the pneumatic suction nozzle, the pneumatic suction nozzle is telescopically slidable relative to the mounting element to adjust a length of a portion of the pneumatic suction nozzle which protrudes out below the mounting element, when the pneumatic suction nozzle is slid farther into the mounting element, the elastic member is compressed.

10. The surface mount machine nozzle of claim 9, wherein the pneumatic suction nozzle defines an elongated perforation therein, the fixing pin extends through the perforation, and the perforation has a length along the telescopically slidable direction of the pneumatic suction nozzle.

11. The surface mount machine nozzle of claim 10, wherein a largest distance between the perforation and the supporting surface is smaller than a length of the elastic element in a natural state.

12. The surface mount machine nozzle of claim 9, wherein the elongated perforation is defined in the pneumatic suction nozzle, and the pivot hole is defined in the mounting element.

13. The surface mount machine nozzle of claim 12, when the fixing pin is located at one end of the perforation, the elastic element is slightly compressed, and the length of the portion of the pneumatic suction nozzle which protrudes out of the mounting element is largest; and when the fixing pin is located at an opposite end of the perforation nearer to the supporting surface, the elastic element is furthest compressed, and the length of the portion of the pneumatic suction nozzle which protrudes out of the mounting element is smallest.

14. The surface mount machine nozzle of claim 9, wherein the pneumatic suction nozzle comprises a main body and a head portion located at a bottom end of the main body, an upper main part of the main body having an inner diameter greater than that of a lower part of the main body, such that the supporting surface is formed at a junction of the main part and the lower part, and the elastic element being received in the main part.

15. The surface mount machine nozzle of claim 9, further comprising a cover and a blocking ring, wherein the mounting element comprises a straight, hollow connecting portion and an enlarged, hollow fixing portion connected with an end of the connecting portion, the connecting portion defining a locating groove in an outer surface thereof adjacent to the end thereof, the blocking ring received in the locating groove with an outer circumferential portion of the blocking ring protruding out of the locating groove, and the cover mounted around the mounting element and sandwiched between the blocking ring and the fixing portion.

16. The surface mount machine nozzle of claim 15, wherein the cover is black and generally bowl shaped.

17. The surface mount machine nozzle of claim 15, wherein the pivot hole is located in the connecting portion and communicates with the locating groove.

18. The surface mount machine nozzle of claim 15, wherein the fixing portion and the blocking ring cooperatively prevent axial movement of the cover.

19. A surface mount machine nozzle, comprising:
a hollow mounting element defining one of a pivot hole and a vertical slot in a sidewall thereof;
a hollow pneumatic suction nozzle partly received in the mounting element, the pneumatic suction nozzle defining the other one of the pivot hole and the vertical slot in a sidewall thereof, and comprising an internal step;
a fixing pin transversely extended through the pivot hole and the slot for connecting the mounting element and the pneumatic suction nozzle together; and
an elastic element received in pneumatic suction nozzle, wherein two opposite ends of the elastic element respectively contact with the fixing pin and the internal step of the pneumatic suction nozzle;
wherein the pneumatic suction nozzle is telescopically slidable in the mounting element with the fixing pin slidable along the slot, the elastic element is compressed when the pneumatic suction nozzle is slid from an extended position to a retracted position, and when the elastic element decompresses the elastic element drives the pneumatic suction nozzle to slide from the retracted position to the extended position.

* * * * *